United States Patent
Li

(10) Patent No.: US 7,449,419 B2
(45) Date of Patent: Nov. 11, 2008

(54) GLASS COMPOSITIONS, GLASS FIBERS, AND METHODS OF INHIBITING BORON VOLATIZATION FROM GLASS COMPOSITIONS

(75) Inventor: Hong Li, Sewickley, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 663 days.

(21) Appl. No.: 10/922,537

(22) Filed: Aug. 20, 2004

(65) Prior Publication Data

US 2005/0107238 A1 May 19, 2005

Related U.S. Application Data

(60) Provisional application No. 60/501,386, filed on Sep. 9, 2003.

(51) Int. Cl.
*C03C 13/06* (2006.01)
*C03C 3/095* (2006.01)

(52) U.S. Cl. .............. 501/36; 501/35; 501/64

(58) Field of Classification Search .......... 501/35, 501/36, 64
See application file for complete search history.

(56) References Cited

U.S. PATENT DOCUMENTS

| 4,882,302 | A | * | 11/1989 | Horiuchi et al. | 501/27 |
|---|---|---|---|---|---|
| 5,332,699 | A | | 7/1994 | Olds et al. | 501/36 |
| 5,714,421 | A | | 2/1998 | Olds et al. | 501/36 |
| 5,910,461 | A | | 6/1999 | Gasca et al. | 501/35 |
| 5,962,354 | A | | 10/1999 | Fyles et al. | 501/36 |
| 6,686,304 | B1 | | 2/2004 | Wallenberger | 501/35 |
| 6,962,886 | B2 | | 11/2005 | Wallengerger | 501/35 |
| 2003/0207748 | A1 | | 11/2003 | Wallenberger | 501/66 |

FOREIGN PATENT DOCUMENTS

| GB | 1531287 | | 5/1976 |
|---|---|---|---|
| JP | 63225552 | A * | 9/1988 |
| JP | 06275618 | | 10/1994 |

OTHER PUBLICATIONS

Derwent Abstract 1988-304828, English language abstract of JP 63-225552 A.*
Database WPI, Section Ch, Week 198843, Derwent Publications Ltd., London, GB, Class A60, AN 1988-304828, XP002347499 & JP 63 225552 A (Nitto Boseki Co Ltd), Sep. 20, 1988 abstract.

* cited by examiner

*Primary Examiner*—Jerry Lorengo
*Assistant Examiner*—Elizabeth A Bolden
(74) *Attorney, Agent, or Firm*—Dennis G. Millman

(57) ABSTRACT

Embodiments of the present invention relate generally to fiberizable glass compositions comprising boron oxide at least one rare earth oxide in a molar ratio of rare earth oxide to boron oxide ranging from 0.01 to 0.33. Other embodiments of the present invention relate to methods of inhibiting boron volatization from glass compositions comprising boron oxide by adding a rare earth oxide to the glass composition before melting the glass compositions. Still other embodiments of the present invention relate to glass fibers formed from the fiberizable glass compositions of the present invention, and polymeric composites and printed circuit boards made therefrom.

17 Claims, 4 Drawing Sheets ately continuous glass fibers by any method known in the art for forming essentially continuous glass fibers. More specifically, the addition of $B_2O_3$ to a fiberizable glass composition can result in a decrease in the forming temperature of the glass composition, as well as a wider fiber-forming window. As used herein, the term "forming temperature" means the temperature at which the glass composition has a viscosity of 1000 poise (or the "log 3 temperature"). Accordingly, the addition of $B_2O_3$ to fiberizable glass compositions can be advantageous in decreasing processing costs, while increasing the robustness of the fiber forming process.

However, when fiberizable glass compositions comprising $B_2O_3$ are processed at elevated temperatures, a portion of the $B_2O_3$ in the glass composition volatizes. Volatization of $B_2O_3$ from fiberizable glass compositions during processing is undesirable as it results in the emission of boron-containing particulate matter (herein after "boron emissions") from the processing equipment. Because boron emissions from processing equipment are desirably kept at or below certain limits, costly emission control systems are sometimes installed to reduce or control boron emissions from the equipment. Accordingly, processing costs associated with the use of glass compositions comprising $B_2O_3$ are increased.

One example of a commercially significant, $B_2O_3$-containing fiberizable glass composition that is useful in making glass fibers suitable for a variety of applications, including electronic and structural reinforcement applications, is $B_2O_3$-containing E-glass. Boron oxide-containing E-glass compositions typically contain intentional $B_2O_3$ additions up to 10 weight percent ("wt. %"). As used herein the term "standard $B_2O_3$-containing E-glass" or "standard $B_2O_3$-containing E-glass compositions" means glass compositions having:

from 2 to 10 wt. % $B_2O_3$;
from 16 to 25 wt. % CaO;
from 12 to 16 wt. % $Al_2O_3$;
from 52 to 62 wt. % $SiO_2$;
0 to 5 wt. % MgO;
0 to 2 wt. % $Na_2O$ and $K_2O$;
0 to 1.5 wt. % $TiO_2$;
from 0.05 to 0.8 wt. % $Fe_2O_3$; and
0 to 1 wt. % $F_2$.

One example of a standard $B_2O_3$-containing E-glass composition, which is useful in making glass fibers for electronic and aerospace applications, is set forth in ASTM Designation: D578-00, "Standard Specification for Glass Fiber Strands" as follows:

from 5 to 10 wt. % $B_2O_3$;
from 16 to 25 wt. % CaO;
from 12 to 16 wt. % $Al_2O_3$;
from 52 to 56 wt. % $SiO_2$;
0 to 5wt. % MgO;
0 to 2 wt. % $Na_2O$ and $K_2O$;
0 to 0.8 wt. % $TiO_2$;
from 0.05 to 0.4 wt. % $Fe_2O_3$; and
0 to 1 wt. % $F_2$.

However, as previously discussed, the volatilization of boron from such $B_2O_3$-containing fiberizable glass compositions during processing is undesirable. Although boron-free E-glass compositions (i.e., E-glass compositions with no $B_2O_3$) and low-boron E-glass compositions (i.e., E-glass compositions with less than 2 wt. % $B_2O_3$) are available, such E-glass compositions may require higher temperatures for both melting and fiber-forming than the standard $B_2O_3$-containing E-glass compositions. Therefore, not only is the energy consumption for melting and forming these compositions higher than for standard $B_2O_3$-containing E-glass, but because of the increased temperatures requirements, the lifetime of the processing equipment (i.e. the melting furnaces and bushings used to form fibers) is comparatively short. Further, for certain applications, for example electronics applications, low-boron and boron-free glass fibers do not meet the requirements of ASTM Designation: D578-00, "Standard Specification for Glass Fiber Strands" discussed above.

Accordingly, it would be advantageous to develop a glass composition comprising $B_2O_3$, and in particular, a fiberizable glass composition containing $B_2O_3$ that is suitable for use in forming fibers for electronic and structural reinforcement applications, and which has a reduced boron volatization as compared to standard $B_2O_3$-containing E-glass compositions. Further, it would be advantageous to develop a method of inhibiting the volatization of boron from glass compositions comprising $B_2O_3$ that can be used in conjunction with a variety of $B_2O_3$ containing glass compositions.

BRIEF SUMMARY OF THE INVENTION

Certain non-limiting embodiments of the present invention provide fiberizable glass compositions. For example, one non-limiting embodiment of the present invention provides a fiberizable glass composition comprising from 9 to 16 weight percent $Al_2O_3$, from 0.5 to 13 weight percent $B_2O_3$, from 16 to 25 weight percent CaO, 0 to 6 weight percent MgO, from 48 to 62 weight percent $SiO_2$, 0 to 4 weight percent $TiO_2$, and $R_2O_3$, wherein a molar ratio of $R_2O_3$ to $B_2O_3$ ranges from 0.01 to 0.33, and R is at least one rare earth element.

Another non-limiting embodiment of the present invention provides a fiberizable glass composition comprising from 12 to 16 weight percent $Al_2O_3$, from 5 to 10 weight percent $B_2O_3$, from 16 to 25 weight percent CaO, 0 to 4 weight percent MgO, from 52 to 56 weight percent $SiO_2$, 0 to 0.8 weight percent $TiO_2$, and $R_2O_3$, wherein a molar ratio of $R_2O_3$ to $B_2O_3$ ranges from 0.01 to 0.33, and R is at least one rare earth element.

Still another non-limiting embodiment of the present invention provides a fiberizable glass composition comprising from 9 to 16 weight percent $Al_2O_3$, from 0.5 to 13 weight percent $B_2O_3$, from 16 to 25 weight percent CaO, 0 to 6 weight percent MgO, from 48 to 62 weight percent $SiO_2$, 0 to 4 weight percent $TiO_2$, and $La_2O_3$, wherein a molar ratio of $La_2O_3$ to $B_2O_3$ ranges from 0.01 to 0.33.

Yet another non-limiting embodiment provides a fiberizable glass composition comprising from 12 to 16 weight percent $Al_2O_3$, from 5 to 10 weight percent $B_2O_3$, from 16 to 25 weight percent CaO, from 2 to 4 weight percent MgO, from 52 to 56 weight percent $SiO_2$, 0 to 0.8 weight percent $TiO_2$, and $R_2O_3$, wherein a molar ratio of $R_2O_3$ to $B_2O_3$ ranges from 0.01 to 0.33, and R is at least one rare earth element.

Another non-limiting embodiment provides a fiberizable glass composition comprising from 12 to 16 weight percent $Al_2O_3$, from 5 to 10 weight percent $B_2O_3$, from 16 to 25 weight percent CaO, 0 to 4 weight percent MgO, from 52 to 56 weight percent $SiO_2$, 0 to 0.8 weight percent $TiO_2$, and $Nd_2O_3$, wherein a molar ratio of $Nd_2O_3$ to $B_2O_3$ ranges from 0.01 to 0.33.

Other non-limiting embodiments of the present invention provide glass fibers formed from the fiberizable glass compositions according to the various non-limiting embodiments of the present invention; while other non-limiting embodiments provide polymeric composites, and in particular printed circuit boards, made using the glass fibers according to the various non-limiting embodiments of the present invention.

Certain non-limiting embodiments of the present invention provide methods of inhibiting boron volatilization during melting and forming from a glass composition comprising $B_2O_3$. For example, according to one non-limiting embodiment, there is provided a method of inhibiting boron volatilization from a glass composition comprising $B_2O_3$, the method comprising adding $R_2O_3$ to the glass composition prior to processing the glass composition such that the glass composition, prior to processing, has a molar ratio of $R_2O_3$ to $B_2O_3$ ranging from 0.01 to 0.33, where R is at least one rare earth element; and processing the glass composition, wherein after processing, the glass composition has a relative boron loss no greater than 5 weight percent of the amount of $B_2O_3$ originally supplied to the composition.

BRIEF DESCRIPTION OF THE SEVERAL VIEWS OF THE DRAWING(S)

Embodiments of the present invention will be better understood when read in conjunction with the drawings, in which.

Figure 1A:
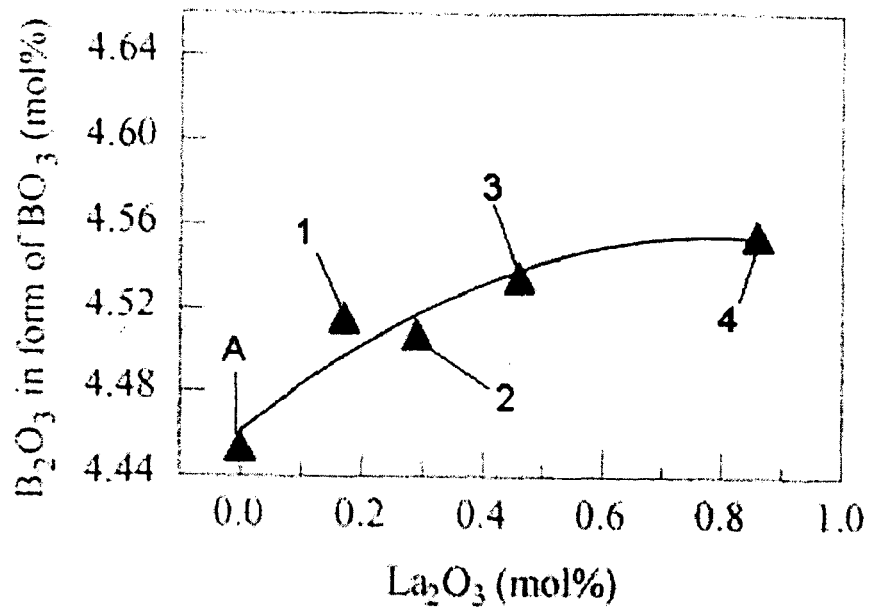
FIG. 1a is plot of mole percent $La_2O_3$ against mole percent $B_2O_3$ in the form of $BO_3$ for a series of fiberizable glass compositions.

DETAILED DESCRIPTION OF THE INVENTION;

Certain embodiments of the present invention can advantageously provide fiberizable glass compositions comprising $B_2O_3$ and having reduced boron volatization as compared to standard $B_2O_3$-containing E-glass compositions, while maintaining desirable log 3 forming temperatures and acceptable processing windows for commercial fiber-forming operations. Further, the fiberizable glass compositions according to certain embodiments of the present invention can be suitable for use in forming glass fibers that can be used in a variety of applications, including both electronic and structural reinforcement applications.

Further, as discussed below in detail, the inventors have found that the fiberizable glass compositions according to certain embodiments of the present invention can have advantageous dielectric properties and can be useful in providing glass fibers with advantageous dielectric properties that may be desirable for use in certain microelectronic packaging applications, such as printed circuit board applications. Additionally, when incorporated into printed circuit boards, the glass fibers according to embodiments of the present invention may impart improved laser drilling response to the printed circuit board. Moreover, glass fibers made in accordance with certain embodiments of the present invention can provide improved composite strength when incorporated into a polymeric matrix material.

Still other embodiments of the present invention can advantageously provide methods of inhibiting the volatization of boron from glass compositions comprising $B_2O_3$ during processing of the glass compositions at elevated temperatures. The methods according these non-limiting embodiments can be particularly useful in reducing boron emissions from glass melting furnaces and other molten glass processing equipment, and are particularly useful in reducing boron emissions from direct-melt fiber forming equipment.

Specific, non-limiting embodiments of the present invention will now be discussed. It should be appreciated that numerical values discussed herein, such as but not limited to weight percent of materials and length of time or temperatures, are approximations and are subject to variations due to various factors well known to those skilled in the art such as, but not limited to, measurement standards, equipment, and techniques. Notwithstanding that the numerical values and parameters setting forth the broad scope of the invention are approximations, the numerical values set forth in the specific examples are reported as precisely as possible. However, as will be understood by one of ordinary skill in the art, these numerical values may contain certain errors necessarily resulting from the respective measurement technique and equipment.

Fiberizable glass compositions according to various non-limiting embodiments of the present invention will now be described. In a first non-limiting embodiment of a fiberizable glass composition according to the present invention there is provided a fiberizable glass composition comprising:

from 9 to 16 weight percent $Al_2O_3$;
from 0.5 to 13 weight percent $B_2O_3$;
from 16 to 25 weight percent CaO;
0 to 6 weight percent MgO;
from 48 to 62 weight percent $SiO_2$;
0 to 4 weight percent $TiO_2$; and $R_2O_3$, wherein a molar ratio of $R_2O_3$ to $B_2O_3$ ranges from 0.01 to 0.33, and R is at least one rare earth element.

As discussed in more detail below, because the fiberizable glass compositions according to this non-limiting embodiment of the present invention comprise at least one rare earth oxide, the fiberizable glass compositions can have reduced boron volatization as compared to $B_2O_3$-containing E-glass compositions comprising similar amounts of $B_2O_3$. Further, although not limiting herein, the fiberizable glass compositions according to this non-limiting embodiment are believed to be suitable for use in most applications in which standard $B_2O_3$-containing E-glass fibers are used.

A second non-limiting embodiment of a fiberizable glass composition according to the present invention provides a fiberizable glass composition comprising:

from 12 to 16 weight percent $Al_2O_3$;
from 5 to 10 weight percent $B_2O_3$;
from 16 to 25 weight percent CaO;
0 to 4 weight percent MgO;
from 52 to 56 weight percent $SiO_2$;
0 to 0.8 weight percent $TiO_2$; and
$R_2O_3$, wherein a molar ratio of $R_2O_3$ to $B_2O_3$ ranges from 0.01 to 0.33, and R is at least one rare earth element.

As discussed above with respect to the first non-limiting embodiment, because the fiberizable glass compositions according to this non-limiting embodiment of the present invention comprise at least one rare earth oxide, the fiberizable glass compositions according to this embodiment can have reduced boron volatization as compared to standard E-glass compositions comprising similar amounts of $B_2O_3$. Further, although not limiting herein, because the fiberizable glass compositions according to this non-limiting embodiment comprise from 5 to 10 weight percent $B_2O_3$, the fiberizable glass compositions are particularly suited for forming glass fibers for electronics applications.

Although not required, according to the non-limiting embodiments of fiberizable glass compositions discussed above, the at least one rare earth element 'R' can be selected from the Group 3 elements in the Periodic Table of the Elements, and is desirably selected from the group consisting of scandium (Sc), yttrium (Y), and the lanthanide series elements (i.e., the elements having atomic numbers 57 (lanthanum (La)) to 71 (lutetium (Lu)). Although not meant to be limiting herein, rare earth elements selected from Sc, Y, and the lanthanide series elements are believe to be desirable for use in these fiberizable glass compositions because these elements generally have a stable 3+ valence or oxidation state and a higher ionic potential in glass than alkali metal or alkaline earth elements. As used herein the term "ionic potential" means the charge or oxidation state of the cation ("Z") divided by the ionic radius of the cation ("r") in Angstroms (Å or $10^{-10}$ meters), or Z/r. Further, the term "ionic potential in glass" means the charge or oxidation state of the cation divided by the ionic radius of the cation in glass.

More particularly, the stable 3+ oxidation state and high ionic potential in glass of these elements are believed to facilitate the preferential formation of certain rare earth-borate complexes in the fiberizable glass compositions according to the non-limiting embodiments of the present invention discussed above. As discussed below in detail, such rare earth-borate complexes can advantageously inhibit boron volatization from the fiberizable glass compositions and provide dielectric properties that are comparable to or better than standard $B_2O_3$-containting E-glass compositions. Generally speaking, however, any rare earth element having a stable 3+ oxidation state and suitably high ionic potential in glass can be useful in the fiberizable glass compositions according to the non-limiting embodiments of the present invention discussed above. More specifically, although not limiting herein, rare earth elements having a 3+oxidation state and an ionic potential in glass of at least 2.5 are believed to be particularly desirable for use in the glass compositions according to the non-limiting embodiments of the present invention discussed above.

Non-limiting examples of several rare earth elements, which are suitable for use in the non-limiting embodiments of the present invention discussed above, and their ionic potentials in glass are given below in Table 1. For comparison, Table 1 also gives the ionic potentials in glass for several alkali metal and alkaline earth elements. Additional information regarding the ionic radii for other rare earth family members, which can be used to calculate their corresponding ionic potentials in glass, can be found in R. D. Shannon and C. T. Prewitt, "Effective Ionic Radii in Oxides and Fluorides," *Acta Cryst.* B25 (1969) 925-946, which is specifically incorporated by reference herein.

TABLE 1

| Family | Element | Oxidation State | Ionic Potential in Glass* |
|---|---|---|---|
| Rare Earth* | Sc | 3+ | 3.448-4.110 |
| | Y | 3+ | 2.956-3.363 |
| | La | 3+ | 2.542-2.828 |
| | Ce | 3+ | 2.632-2.901 |
| | Nd | 3+ | 2.752-3.015 |
| | Sm | 3+ | 2.752-3.112 |
| | Eu | 3+ | 2.804-3.158 |
| | Gd | 3+ | 2.830-3.198 |
| | Er | 3+ | 3.000-3.405 |
| | Lu | 3+ | 3.093-3.538 |
| Alkali Metal | Li | 1+ | 1.351 |
| | Na | 1+ | 0.885-0.980 |
| | K | 1+ | 0.662-0.725 |
| | Rb | 1+ | 0.625-0.671 |
| | Cs | 1+ | 0.588 |
| Alkaline Earth | Mg | 2+ | 2.778, 4.082 |
| | Ca | 2+ | 1.786-2.00 |
| | Sr | 2+ | 1.250-1.160 |
| | Ba | 2+ | 1.360-1.420 |

*Based on a coordination number with oxygen from 6 to 8.

In a third non-limiting embodiment of a fiberizable glass composition according to the present invention, the rare earth element is R is lanthanum. More particularly, according to this non-limiting embodiment the fiberizable glass composition comprises:

from 9 to 16 weight percent $Al_2O_3$;
from 0.5 to 13 weight percent $B_2O_3$;
from 16 to 25 weight percent CaO;
0 to 6 weight percent MgO;
from 48 to 62 weight percent $SiO_2$;
0 to 4 weight percent $TiO_2$; and
$La_2O_3$, wherein a molar ratio of $La_2O_3$ to $B_2O_3$ ranges from 0.01 to 0.33.

Although not meant to be limiting herein, because the fiberizable glass compositions according to this non-limiting embodiment of the present invention comprise $La_2O_3$, the fiberizable glass compositions can have lower boron volatization than standard E-glass compositions comprising similar amounts of $B_2O_3$. Further, the fiberizable glass compositions according to this non-limiting embodiment can be desirable for use in low-cost, high volume fiber-forming operations to form glass fibers that will be incorporated into polymeric composites. More particularly, although not limiting herein, the use of $La_2O_3$ in the fiberizable glass compositions according to this non-limiting embodiment is desirable as $La_2O_3$ will not effect the color or the redox state of the glass composition, and is the lowest cost rare earth oxide presently available.

As previously mentioned, the addition of at least one rare earth oxide to the fiberizable glass compositions according to the non-limiting embodiments of the present invention can advantageously inhibit boron volatization from the glass compositions during processing of the glass composition at elevated temperatures, such as during melting and/or fiberforming. Further, as discussed below, the presence of the at least one rare earth oxide in the glass compositions according to the non-limiting embodiments of the present invention is believed to contribute to enhanced dielectric properties and laser drilling response in glass fibers formed therefrom.

While not intending to be bound by any particular theory, generally, glasses formed from borosilicate compositions are comprised of both amorphous $SiO_2$ networks and amorphous $B_2O_3$ networks. See S. Wang and J. F. Stebbins, "Multiple-Quantum Magic-Angle Spinning $^{17}O$ NMR Studies of Borate, Borosilicate, and Boroaluminate Glasses," *J. Am. Ceram. Soc.*, 82 (1999) 1519. Amorphous $B_2O_3$ networks are typically comprised of trigonal $BO_3$ structural units. However, when alkali metal oxides are introduced into the borosilicate glass composition (such as in standard $B_2O_3$-containing E-glass compositions), the alkali metal oxides tend to preferentially diffuse or partition into the amorphous $B_2O_3$ network. When alkali metal oxides are introduced into the amorphous $B_2O_3$ network, tetrahedral $BO_4$ structural units are formed, with alkali metal cation acting to compensate the local charge by forming an alkali-borate complex. See J. Zhong and P. J. Bray, "Change in Boron Coordination in Alkali Borate Glasses, and Mixed Alkali Effects, as Elucidated by NMR," *J. Non-Cryst. Solids*, 111 (1989) 67-76. However, such alkali-borate complexes have high vapor pressures and are easily volatized at elevated temperatures. Accordingly, when a borosilicate glass composition comprising one or more alkali metal oxides is melted, a portion of the boron in the glass composition is lost due to volatization of high vapor pressure alkali-borate complexes.

Alkaline earth oxides behave similarly to alkali metal oxides in forming borate complexes in $B_2O_3$-containing glass compositions. However, while alkaline earth cations have higher ionic potentials in glass than alkali metal cations (see Table 1) and alkaline-borate complexes are less volatile than alkali-borate complex, the addition of high concentrations of CaO plus small amounts of MgO (i.e., MgO additions of about 0.5 wt. % or less) to standard $B_2O_3$-containing E-glass compositions is sometimes not as effective as would be desired for inhibiting boron volatization from the molten glass.

Rare earth oxides added to borosilicate glass compositions will also tend to partition into the amorphous $B_2O_3$ network. However, in contrast to alkali metal oxides, when rare earth oxides are introduced into the amorphous $B_2O_3$ network, the rare earth cation is believed to form a complex with two $BO_3$ structural units and one $BO_4$ structural unit. See H. Li, L. Li, J. D. Vienna, M. Qian, Z. Wang, J. G. Darab, D. K. Peeler, "Neodymium (III) in Alumino-Borosilicate Glasses," *Journal of Non-Crystalline Solids*, 278 (2000) 35-57. and H. Li, Y. Su, L. Li, and D. M. Strachan, "Raman Spectroscopic Study of Gadolinium (III) in Sodium-aluminoborosilicate Glass," *Journal of Non-Cryst. Solids*, 292 (2001)167-176. Because such rare earth-borate complexes have lower vapor pressures than the alkali-borate complexes discussed above, the rare earth-borate complexes will not readily volatized when the glass is melted. Therefore, the rate of boron volatization from the glass composition comprising the rare earth oxide should be lower than for a similar glass composition that do not contain the rare earth oxide. Further, because rare earth cations, and in particular cations of elements selected from the group consisting of Sc, Y, and lanthanide series elements, have a higher ionic potential in glass than both alkali metal cations and most alkaline earth cations (see Table 1), rare earth-borate complexes will preferentially form over alkali-borate and most alkaline-borate complexes when rare earth oxides and alkaline earth oxides and/or alkali metal oxides are added to the borosilicate glass composition.

Figure 1B:
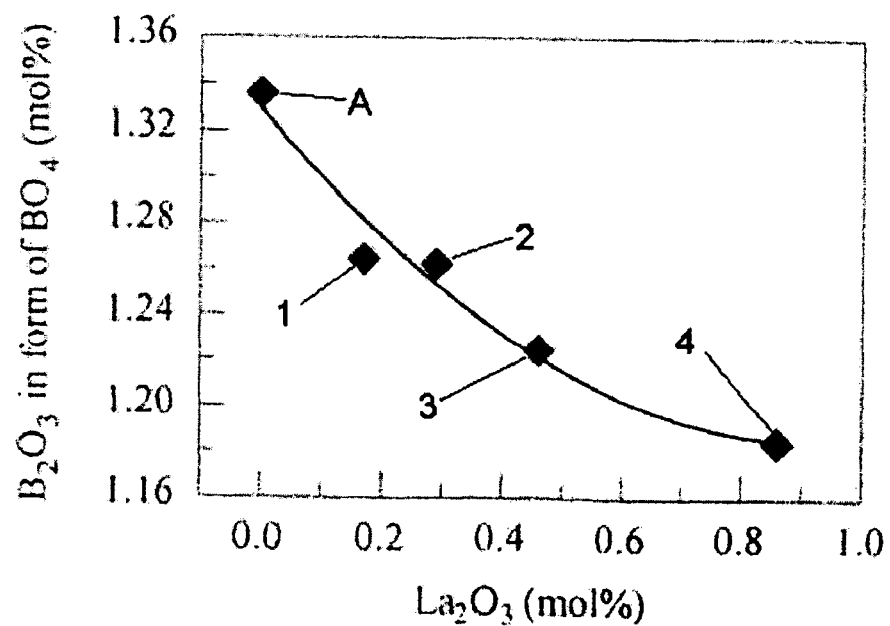
FIG. 1b is plot of mole percent $La_2O_3$ against mole percent $B_2O_3$ in the form of $BO_4$ for a series of fiberizable glass compositions.

Referring now to FIGS. 1a and 1b (which are explained in more detail in Example 1 below) there are shown plots of $^{11}B$ MAS NMR (Magic Angle Spinning Nuclear Magnetic Resonance) derived speciation of boron in a series of non-limiting examples of fiberizable glass compositions according to the non-limiting embodiments of the present invention identified as compositions 1-4 in Example 1 (indicated by numbers 1-4 in FIGS. 1a and 1b), along with the standard $B_2O_3$-containing E-glass composition set forth in Example 1 (indicated as "A" in FIGS. 1a and 1b). More particularly, FIG. 1a shows a plot of mole percent ("mol. %") $B_2O_3$ in the form of $BO_3$ structural units as a function of mol. % $La_2O_3$ for the series of non-limiting examples of fiberizable glass compositions according to the non-limiting embodiments of the present invention previously discussed and a standard $B_2O_3$-containing E-glass composition; and FIG. 1b shows a plot of mol. % $B_2O_3$ in the form of $BO_4$ structural units as a function of mol. % percent $La_2O_3$ for the same glass compositions. As can be seen from the plots of FIGS. 1a and 1b, as the content of $La_2O_3$ increases in the glass composition, the percentage of $B_2O_3$ in the form of $BO_4$ structural units decreases, while the percentage of $B_2O_3$ in the form of $BO_3$ structural units increases. As discussed above, this is believed to be attributable to the preferential formation of rare earth-borate complexes in the glass structure as compared to alkali-borate complexes with increasing $La_2O_3$ additions. Further, as previously discussed, because rare earth-borate complexes have lower vapor pressures than alkali-borate complexes, it is expected that the rate of volatization of boron from the series of non-limiting examples glass compositions according to the non-limiting embodiments of the present invention previously discussed will be lower than the rate of volatization of boron from standard $B_2O_3$-containing E-glass compositions.

Figure 2:
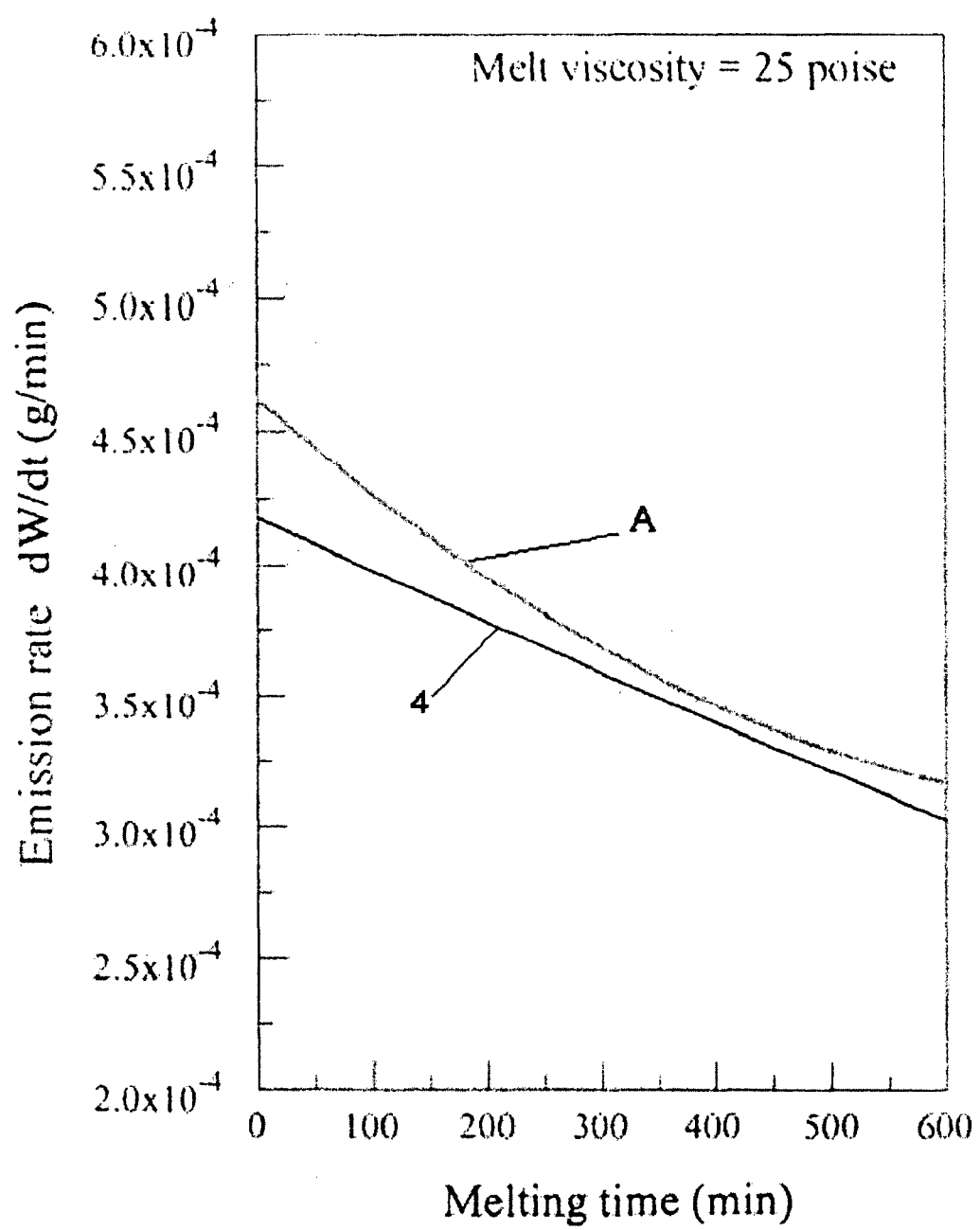
FIG. 2 is a plot of boron emission rate against time for a fiberizable glass composition according to non-limiting embodiments of the present invention and a comparative fiberizable glass composition.
Figure 3:
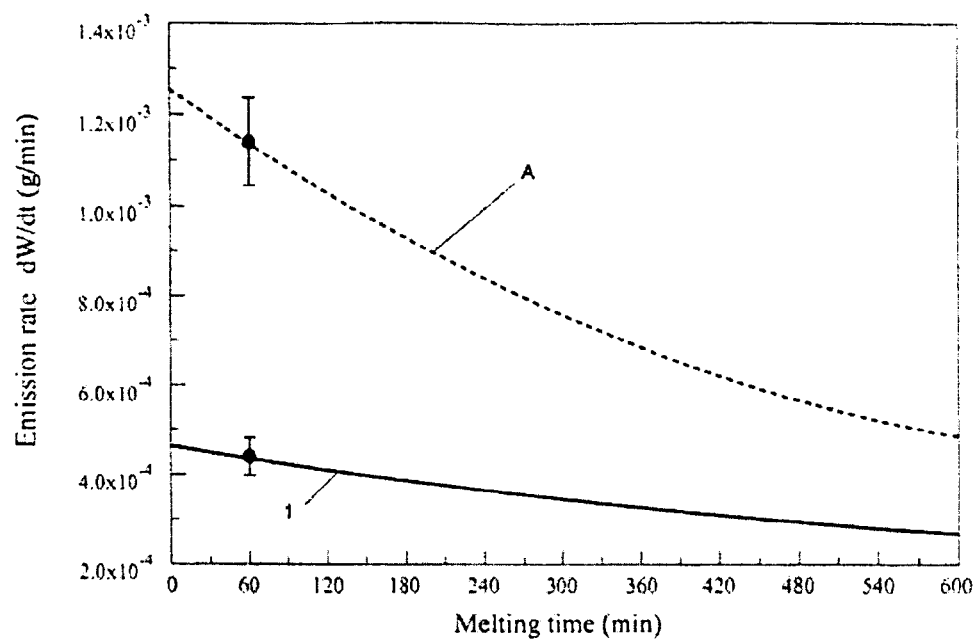
FIG. 3 is a plot of boron emission rate against time for a fiberizable glass composition according to non-limiting embodiments of the present invention and a comparative fiberizable glass composition.

Referring now to FIGS. 2 and 3. As discussed in more detail below in Example 2, in FIG. 2 there is shown a plot of boron emission rate versus time for one non-limiting example of a fiberizable glass composition according to the non-limiting embodiments identified as composition 4 in Example 1 (indicated as "4" in FIG. 2) and a plot of boron emission rate versus time for the standard $B_2O_3$-containing E-glass composition (indicated as "A"). Further, as discussed in more detail below in Example 3, in FIG. 3 there is shown a plot of boron emission rate versus time for another non-limiting example of a fiberizable glass composition according to the non-limiting embodiments of the present invention identified as composition 1 in Example 1 (indicated as "1" in FIG. 3) and a similar plot for a standard $B_2O_3$-containing E-glass composition (indicated as "A"). The plots of both FIGS. 2 and 3 were obtained using thermogravimetric analysis (or "TGA"), which is well known in the art. As can be seen from FIGS. 2 and 3, the example fiberizable glass compositions 4 and 1, respectively, have a lower boron emission rates than the standard $B_2O_3$-containing E-glass composition.

Although not limiting herein, the fiberizable glass compositions according to the various non-limiting embodiments of the present invention discussed herein can have a relative boron loss during processing (for example, during melting and fiber-forming) less than 5%. As used herein the term "relative boron loss" means the of the amount of $B_2O_3$ in the glass batch composition ("$W_B$") (i.e., before processing) less the amount of $B_2O_3$ determined to be in the glass after processing ("$W_G$") quantity divided by the amount of $B_2O_3$ in the glass batch composition (i.e., ($W_B$-$W_G$)/$W_B$), and is an indication boron volatization during processing. However, those skilled in the art will appreciate that it is generally desirable to have the lowest relative boron losses possible. Accordingly, the relative boron loss from the fiberizable glass compositions according to the non-limiting embodiments of the present invention can be less than 2%. Further, the fiberizable glass compositions according to the various non-limiting embodiments of the present invention discussed herein can have no relative boron loss during processing.

In addition to desirably low boron volatization, as previously discussed, the fiberizable glass compositions according to the non-limiting embodiments of the present invention can have desirable dielectric properties, and in particular, dielectric constants and low dissipation factors that are comparable to or lower than commercially available, $B_2O_3$-containing E-glass compositions, which typically have a dielectric constant at 1 MHz of about 7.3 and a dissipation factor at 1 MHz of about 0.01. For example, although not limiting herein, fiberizable glass compositions according to the non-limiting embodiments of the present invention can have dielectric constants at 1 MHz no greater than about 7.5 and dissipation factors at 1 MHz no greater than about 0.01. More desirably, the fiberizable glass composition according to the non-limiting embodiments of the present invention can have dielectric constants at 1 MHz less than about 7.3 and dissipation factors at 1 MHz no greater than about 0.005.

As previously described, due to the presence of alkali metal cations in standard $B_2O_3$-containing E-glass compositions, alkali-borate complexes will be formed. These complexes are associated with the formation of tetrahedrally coordinated boron, i.e., tetrahedral $BO_4$ structural units. However, such tetrahedral $BO_4$ structural units contain nonbridging oxygens that are substantially more polar than bridging oxygens. In contrast, trigonal $BO_3$ structural units are composed of only bridging oxygens and therefore are less polar than $BO_4$ structural units. As a result, borate glasses with only $BO_3$ structural units have dielectric constant at 1 MHz near 3 whereas the borate glasses with a mixture of $BO_3$ and $BO_4$ units have dielectric constants at 1 MHz as high as 8. See H. Scholze, *Glass Nature, Structure, and Properties*, translated by M. J. Larkin (Springer-Verlag, New York, 1991) at page 318 and references cited therein. Accordingly, as the number of $BO_4$ structural units in the glass composition increases, the dielectric constant and dissipation factor of the glass composition should also increase. However, when rare earth oxides are added to the glass composition, as discussed above, the rare earth cations will preferentially form rare earth-borate complexes, thereby reducing or preventing the formation of alkali-borate complexes. As shown in FIGS. 1a and 1b, for a given $B_2O_3$ content, as the amount of rare earth oxide addition increases, the number of $BO_4$ structural units decreases and the number of $BO_3$ structural units increases. Accordingly, it is expected that fiberizable glass compositions according to the non-limiting embodiments of the present invention will have lower dielectric constants and dissipation factors than standard $B_2O_3$-containing E-glass compositions having similar $B_2O_3$ contents.

Figure 4:
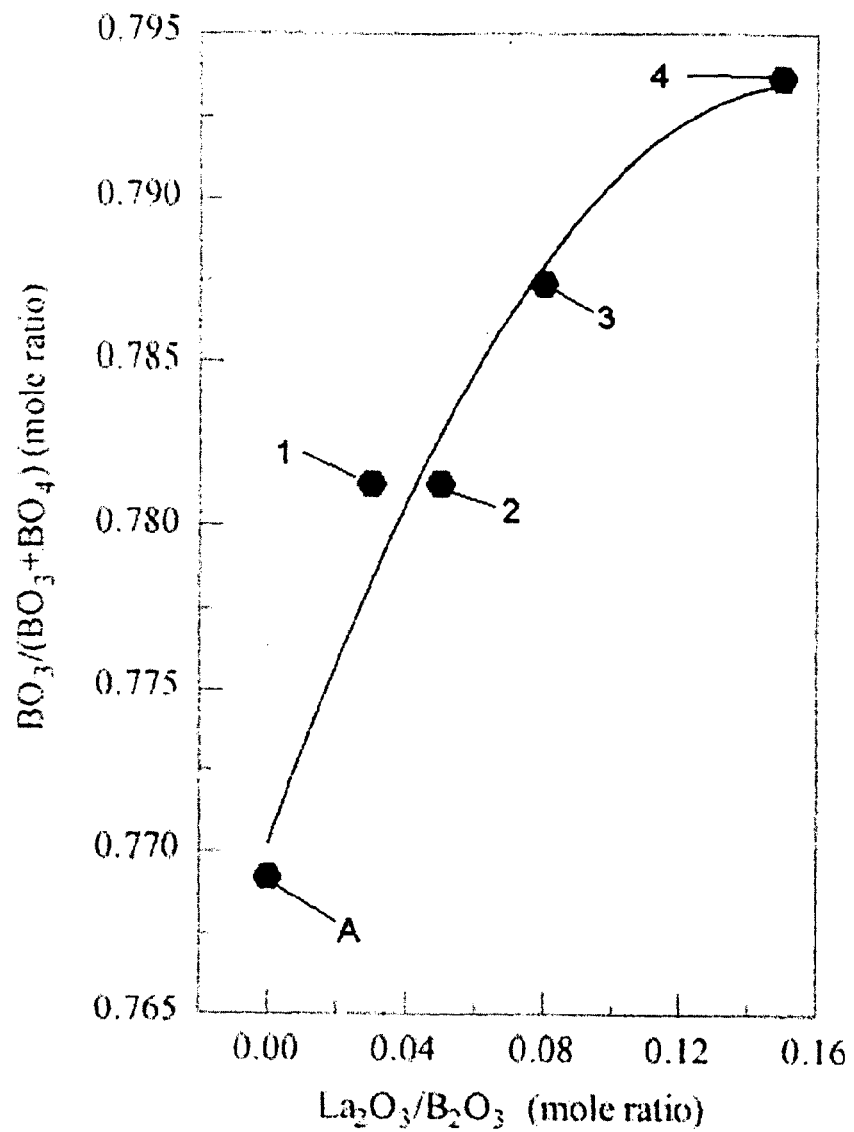
FIG. 4 is a plot of the molar ratio of $BO_3/(BO_3+BO_4)$ against the molar ratio of $La_2O_3/B_2O_3$ for a series of fiberizable glass compositions.

This effect is further demonstrated in FIG. 4 for the series of fiberizable glass compositions discussed above with respect of FIGS. 1a and 1b. As shown in FIG. 4, as the molar ratio of $La_2O_3$ to $B_2O_3$ increases, the molar ratio of $BO_3$ structural units normalized to the sum of $BO_3$ plus $BO_4$ structural units in the glass composition increases. As previously discussed, increasing the number of $BO_3$ structural units can be advantageous in providing desirable dielectric properties to the fiberizable glass compositions. Accordingly, although not required, the fiberizable glass compositions according to the non-limiting embodiments of the present invention discussed above can comprise a molar ratio of $BO_3/(BO_3+BO_4)$ of at least 0.775, and desirably have molar ratios of $BO_3/(BO_3+BO_4)$ greater than 0.775.

Because the fiberizable glass compositions according to the various non-limiting embodiments of the present invention can have lower dielectric constants and dissipation factors than standard $B_2O_3$-containing E-glass compositions, the fiberizable glass compositions according the non-limiting embodiments of the present invention can be particularly desirable for use in microelectronic packaging applications, for example, printed circuit board ("PCB") applications. For example, although not limiting herein, it is generally understood in the art that the propagation speed of a signal in a signal line is affected by the dielectric constant of the surrounding materials. For example, the dielectric constant of a circuit board will affect the propagation speed of signals in the PCB signal lines. More particularly, the higher the dielectric constant of the PCB, the longer the signal propagation time will be (i.e., the slower the propagation speed).

Further, as will be appreciated by those skilled in the art, PCBs are typically formed from fiber glass reinforced polymer materials or composites, which comprise a polymeric matrix material (such as epoxy) reinforced with a woven or non-woven glass fabric. The dielectric constant of such composite PCBS, therefore, is affected by the dielectric constant of the polymeric matrix material and the dielectric constant of the reinforcing glass fibers. Therefore, for a given polymeric matrix material, decreasing the dielectric constant of the glass fibers will result in a decrease in the dielectric constant of the PCB, and relatively shorter signal propagation times in the PCB.

Similarly, degradation of a signal as it propagates through a signal line is affected by the dissipation factor of the surrounding material. For example, the dissipation factor of a PCB will affect signal degradation in PCB signal lines. Generally speaking, the higher the dissipation factor of the PCB, the more the signal will be degraded as it propagates through the signal line. Since the dissipation factor of the PCB is related to the dissipation factor of the polymeric matrix material and the reinforcing glass fibers, for a given polymeric matrix material, decreasing the dissipation factor of the glass fibers can result in a decrease in the dissipation factor of the PCB, and therefore, relatively less signal degradation.

Surprisingly, it has been observed by the inventors that when at least 2 weight percent MgO is added to the fiberizable glass compositions according the non-limiting embodiments of the present invention, further improvements in dielectric constant and dissipation factor as compared to commercially available E-glass compositions can be achieved. Accordingly, a fourth non-limiting embodiment of a fiberizable glass composition according to the present invention provides a fiberizable glass composition comprising:

from 12 to 16 weight percent $Al_2O_3$;
from 5 to 10 weight percent $B_2O_3$;
from 16 to 25 weight percent CaO;
2 to 4 weight percent MgO;
from 52 to 56 weight percent $SiO_2$;
0 to 0.8 weight percent $TiO_2$; and $R_2O_3$, wherein a molar ratio of $R_2O_3$ to $B_2O_3$ ranges from 0.01 to 0.33, and R is at least one rare earth element.

According to this non-limiting embodiment, the at least one rare earth element R can be selected as described above. Although not meant to be limiting herein (and as discussed below in Example 6), dielectric constants at 1 MHz no greater than 7.2 and dissipation factors at 1 MHz no greater than 0.003 have been observed for non-limiting examples of fiberizable glass compositions according to this non-limiting embodiment of the present invention.

Further, it has been observed by the inventors that the fiberizable glass compositions according to the various non-limiting embodiments of the present invention discussed above can impart favorable laser drilling response to PCBs incorporating glass fibers made therefrom. That is, generally, laser drilling of glass fiber reinforced PCBs is difficult because of the high energy necessary to ablate the glass fibers. However, although not meant to be limiting herein, by increasing the UV absorption of the fiberizable glass compositions according to non-limiting embodiments of the present invention, the rare earth oxides in the fiberizable glass compositions can improve the laser drilling response of glass fibers made therefrom. Accordingly, PCB containing glass fibers made from the fiberizable glass compositions according to the non-limiting embodiments of the present invention should also have a favorable laser drilling response.

Illustrative of the UV absorbance of fiberizable glass compositions according to the present invention, the UV absorbance of the commercially available, $B_2O_3$-containing E-glass fiber for electronics applications designated as composition "A" in Table 2 was compared to that of composition 1 in Table 2. Composition 1 displayed higher absorption of UV energy than composition "A" throughout the range of about 355 to about 370 nm. That this increased UV absorption can improve the laser drilling response of the glass fibers formed from fiberizable glass composition was demonstrated by further comparison of these two compositions. Specifically, penetration depths of single pulses from a UV laser drill into glass samples of composition "A" and composition 1 were measured over a range of pulse energy levels ranging from about 60 mJ to about 120 mJ, and the penetration depth was observed to be significantly greater for composition 1 than for composition "A."

Although not limiting to the invention, among the rare earth oxides, neodymium oxide (i.e., $Nd_2O_3$) can be particularly advantageous in improving the laser drilling response of the fiberizable glass compositions according to the various non-limiting embodiments of the present invention. While not intending to be bound by any particular theory, it has been observed that $Nd_2O_3$ can contribute additional absorbance to the glass compositions at a wavelength that coincides with typical UV laser drilling wavelengths, for example about 355 nm. For a series of non-limiting example glass compositions according to the fifth non-limiting embodiment of the present invention (discussed below), as the weight percent of $Nd_2O_3$ in the glass compositions was increased from about 1 wt. % to about 8 wt. %, while the $B_2O_3$ content was kept at about 6 wt. % (corresponding to molar ratios of $Nd_2O_3$ to $B_2O_3$ ranging from 0.03 to 0.26, respectively), the absorbance of the glass compositions at 355 nm was observed to increase.

Accordingly, by selecting neodymium as the rare earth element 'R', a further improvement of the laser drilling efficiency of the fiberizable glass compositions according to the fifth non-limiting embodiment of the present invention can be achieved. More specifically, the fifth non-limiting embodiment of a fiberizable glass composition provides a fiberizable glass composition comprising:

from 12 to 16 weight percent $Al_2O_3$;
from 5 to 10 weight percent $B_2O_3$;
from 16 to 25 weight percent CaO;
0 to 4 weight percent MgO;
from 52 to 56 weight percent $SiO_2$;
0 to 0.8 weight percent $TiO_2$; and
$Nd_2O_3$, wherein a molar ratio of $Nd_2O_3$ to $B_2O_3$ ranges from 0.01 to 0.33.

As discussed above, as although not meant to be limiting herein, the fiberizable glass compositions according to the fifth non-limiting embodiment of the present invention can have desirably low boron emissions due to the presence of a rare earth oxide in the glass composition (as discussed above). Moreover, as discussed above, the fiberizable glass compositions according to this non-limiting embodiment can be particularly suited for use in printed circuit board applications requiring laser drilling due to the presence of $Nd_2O_3$ in the fiberizable glass composition.

As indicated above, the fiberizable glass compositions according to the various non-limiting embodiments of the present invention discussed above can comprise a molar ratio of $R_2O_3$ to $B_2O_3$ ranging from 0.01 to 0.33, where R is at least one rare earth element. Although not meant to be limiting herein, molar ratios of $R_2O_3$ to $B_2O_3$ greater than 0.33 (or ⅓) are believed to be unnecessary from the standpoint of inhibiting boron volatization from the fiberizable glass compositions during processing at elevated temperatures and, therefore, lowering boron emission form the processing equipment. As previously discussed, although not meant to be bound by any particular theory, because each rare earth cation in the glass composition is believed to bond with two $BO_3$ and one $BO_4$ structural units to form desired rare earth-borate complexes, when the $R_2O_3$ to $B_2O_3$ ratio is greater than ⅓, more rare earth cations will be generated than can form the desired borate complexes. Further, it will be appreciated by one skilled in the art that rare earth oxides can be expensive. Therefore, in cost-sensitive applications, it is generally desirable to utilize the lowest effective, molar ratio of $R_2O_3$ to $B_2O_3$ possible. However, molar ratios of $R_2O_3$ to $B_2O_3$ less than 0.01 are believed to be less effective or ineffective in reducing boron emission by any appreciable level since only a small number of rare earth cations will be available to form the desired rare earth-borate complexes. Thus, for example, when cost is a factor, a molar ratio of $R_2O_3$ to $B_2O_3$ ranging from 0.01 to 0.15 may be used in accordance with the various non-limiting embodiments of fiberizable glass composition discussed herein.

Further, because the fiberizable glass compositions according the various non-limiting embodiment of the present invention previously discussed comprise $B_2O_3$, the log 3 forming temperatures and the processing windows of these glass compositions are similar to that of standard $B_2O_3$-containing E-glass compositions comprising similar amounts of $B_2O_3$. For example, the fiberizable glass compositions according to the various non-limiting embodiment of the present invention discussed above can have log 3 forming temperatures no greater than 1200° C., liquidus temperatures no greater than 1140° C., and ΔT values of at least 55° C. As used herein, "ΔT" or "delta T" means the numeric difference between the log 3 forming temperature and the liquidus temperature of the glass composition and is an indication of the robustness of a fiber-forming process. For example, when ΔT values are less than about 55° C., the fiber-forming window is generally considered unacceptably narrow for commercial, direct-melt fiber forming operations. That is, the difference between the fiber-forming temperature (i.e., the log 3 forming temperature) and the temperature at which the glass will begin to crystallize or devitrify (i.e., the liquidus temperature) is relatively small. Conversely, when ΔT is about 55° C. or greater, the fiber-forming window for the glass composition is generally considered to be acceptable for commercial, direct-melt fiber forming operations because the difference between the fiber-forming temperature and the temperature at which the glass will devitrify is relatively large.

Although not required, in order to adjust the processing characteristics and redox state of the glass composition, the fiberizable glass compositions according to the various non-limiting embodiments of the present invention discussed above can further comprise 0 to 1 wt. % $Fe_2O_3$, no more than 1 wt. %. $F_2$, and 0 to 2 wt. % of at least one alkali metal oxides selected from the group consisting of $Na_2O$, $K_2O$, and $Li_2O$. Minor amounts (i.e. less than about 0.5 wt. %) of other glass refining agents such as $Sb_2O_3$, $MnO_2$, $As_2O_3$ may also be used in conjunction with the fiberizable glass compositions of the present invention if desired.

Further, it will be appreciated by those skilled in the art that fiberizable glass compositions generally also contain minor amounts of impurities that are attributable, for example, to impurities in the batch ingredients and/or corrosion of furnace refractory materials. For example, although not limiting herein, oxide impurities such as $Na_2O$, $K_2O$, $Cr_2O_3$, SrO, BaO, and $ZrO_2$, as well as sulfates and sulfides may also be present in the fiberizable glass compositions according to the various embodiments of the present invention. In addition, other impurities such as Pb, Ni, Cu, Zn, may also be present in the glass composition.

Non-limiting embodiments of glass fibers according the present invention will now be described. One non-limiting embodiment of a glass fiber according to the present invention provides a glass fiber comprising:
 from 9 to 16 weight percent $Al_2O_3$;
 from 0.5 to 13 weight percent $B_2O_3$;
 from 16 to 25 weight percent CaO;
 0 to 6 weight percent MgO;
 from 48 to 62 weight percent $SiO_2$;
 0 to 4 weight percent $TiO_2$; and
 $R_2O_3$, wherein a molar ratio of $R_2O_3$ to $B_2O_3$ ranges from 0.01 to 0.33, and R is at least one rare earth element.

Although not limiting herein, for the reasons discussed above with respect to the first non-limiting embodiment of a fiberizable glass composition according to the present invention, the glass fibers according to this non-limiting embodiment are believed to be suitable for use a variety of applications, including both electronic and structural reinforcement applications.

A second non-limiting embodiment of a glass fiber according to the present invention provides a glass fiber comprising:
 from 12 to 16 weight percent $Al_2O_3$;
 from 5 to 10 weight percent $B_2O_3$;
 from 16 to 25 weight percent CaO;
 0 to 4 weight percent MgO;
 from 52 to 56 weight percent $SiO_2$;
 0 to 0.8 weight percent $TiO_2$; and
 $R_2O_3$, wherein a molar ratio of $R_2O_3$ to $B_2O_3$ ranges from 0.01 to 0.33, and R is at least one rare earth element.

Although not limiting herein, for the reasons discussed above with respect to the second non-limiting embodiment of a fiberizable glass composition according to the present invention, the glass fibers according to this non-limiting embodiment are believed to be particularly suited for use in electronics applications.

A third non-limiting embodiment of a glass fiber according to the present invention provides a glass fiber comprising:
 from 9 to 16 weight percent $Al_2O_3$;
 from 0.5 to 13 weight percent $B_2O_3$;
 from 16 to 25 weight percent CaO;
 0 to 6 weight percent MgO;
 from 48 to 62 weight percent $SiO_2$;
 0 to 4 weight percent $TiO_2$; and
 $La_2O_3$, wherein a molar ratio of $La_2O_3$ to $B_2O_3$ ranges from 0.01 to 0.33.

Although not limiting herein, for the reasons discussed above with respect to the third non-limiting embodiment of a fiberizable glass composition according to the present invention, the glass fibers according to this non-limiting embodiment are believed to be particularly suited those applications wherein the color and/or cost of the glass fibers is of importance.

A fourth non-limiting embodiment of a glass fiber according to the present invention provides a glass fiber comprising:
 from 12 to 16 weight percent $Al_2O_3$;
 from 5 to 10 weight percent $B_2O_3$;
 from 16 to 25 weight percent CaO;
 2 to 4 weight percent MgO;
 from 52 to 56 weight percent $SiO_2$;
 0 to 0.8 weight percent $TiO_2$; and
 $R_2O_3$, wherein a molar ratio of $R_2O_3$ to $B_2O_3$ ranges from 0.01 to 0.33, and R is at least one rare earth element.

Although not limiting herein, for the reasons discussed above with respect to the fourth non-limiting embodiment of a fiberizable glass composition according to the present invention, the glass fibers according to this embodiment are believed to be particularly suited for PCB applications.

A fifth non-limiting embodiment of a glass fiber according to the present invention provides a glass fiber comprising:
 from 12 to 16 weight percent $Al_2O_3$;
 from 5 to 10 weight percent $B_2O_3$;
 from 16 to 25 weight percent CaO;
 0 to 4 weight percent MgO;
 from 52 to 56 weight percent $SiO_2$;
 0 to 0.8 weight percent $TiO_2$; and
 $Nd_2O_3$, wherein a molar ratio of $Nd_2O_3$ to $B_2O_3$ ranges from 0.01 to 0.33.

Although not limiting herein, for the reasons discussed above with respect to the fifth non-limiting embodiment of a fiberizable glass composition according to the present invention, the glass fibers according to this embodiment are believed to be particularly suited for PCB applications involving laser drilling.

Moreover, because the glass fibers according to the various non-limiting embodiments of the present invention contain $B_2O_3$, it is expected that the glass compositions from which the glass fibers are formed will have similar processing characteristics as standard $B_2O_3$-containing E-glass compositions. However, unlike standard $B_2O_3$-containing E-glass fibers, because the glass fibers according to the non-limiting embodiments of the present invention are formed from glass compositions comprising $B_2O_3$ and at least one rare earth oxide, boron emissions from the fiber processing equipment during melting and forming of the glass fibers according to non-limiting embodiments of the present invention are expected to be lower than the boron emissions from standard $B_2O_3$-containing E-glass fiber forming operations when equivalent amounts of $B_2O_3$ are used.

Further, the glass fibers according to the non-limiting embodiments of the present invention can be useful in forming PCBs. As previously discussed with respect to the fiberizable glass compositions according to the present invention, the addition of rare earth oxides to fiberizable glass compositions comprising $B_2O_3$ can result in the generation of fewer polar $BO_4$ structural units and more $BO_3$ structural units in the glass composition than in standard $B_2O_3$-containing E-glass compositions. Since $BO_3$ structural units are less polar than $BO_4$ structural units, the glass fibers formed from such fiberizable glass compositions comprising $B_2O_3$ and at least one rare earth oxide can have advantageous dielectric properties associated with the increased number of $BO_3$ structural units. For example, although not limiting herein, the glass fibers according to the various non-limiting embodiment of the present invention can have a dielectric constant at 1 MHz of no greater than 7.5 and a dissipation factor at 1 MHz of no greater than 0.01; and more desirably have a dielectric constant at 1 MHz of less than 7.3 and a dissipation factor at 1 MHz no greater than 0.005. Additionally, as previously discussed with respect to the fiberizable glass compositions according to the non-limiting embodiments of the present invention, the glass fibers according to the various non-limiting embodiments of the present invention can also have improved laser drilling response as compared to standard $B_2O_3$-containing E-glass fibers.

Although not limiting herein, the glass fibers according to the non-limiting embodiments of the present invention can also be useful in structural reinforcement applications, and may impart improved strength to polymeric composites made therefrom. Although not meant to be bound by any particular theory, it is believed by the inventors that the polymeric composites made using glass fibers according to the non-limiting embodiments of the present invention can have improved tensile strength due to the presence of rare earth oxides in the glass composition. More particularly, it has been observed that fibers having rare earth elements present on their surfaces can have improved mechanical properties. See Y. Xue, X. Cheng, "Effect of Rare Earth Elements' Surface Treatment on Tensile Properties and Microstructure of Glass Fiber-Reinforced Polytetrafluoroethylene Composites,") *J. Appl. Polymer Sci.*, 86 (2002) 1667-1672. Accordingly, because the glass fibers according to the non-limiting embodiments of the present invention comprise rare earth oxides, polymeric composites made using these glass fibers may display improved mechanical properties as compared to polymeric composites made using similar $B_2O_3$-containing E-glass fibers without rare earth oxide additions.

The glass fibers according to the various non-limiting embodiments of the present invention can be formed using any process known in the art for forming glass fibers, and more desirably, any process known in the art for forming essentially continuous glass fibers. For example, although not limiting herein, the glass fibers according to the non-limiting embodiments of the present invention can be formed using direct-melt or indirect-melt fiber forming methods. These methods are well known in the art and further discussion thereof is not believed to be necessary in view of the present disclosure. See K. L. Loewenstein, *The Manufacturing Technology of Continuous Glass Fibres*, $3^{rd}$ Ed., Elsevier, N.Y., 1993 at pages 47-48 and 117-234, which are hereby specifically incorporated by reference herein.

The present invention further contemplates polymeric composites, and in particular PCBs, made from the glass fibers according to various embodiments of the present invention. As previously discussed, embodiments of the present invention can be advantageous in providing glass fibers with desirable dielectric properties, such as dielectric constant and/or dissipation factor, that are comparable to or lower than standard $B_2O_3$-containing E-glass fibers. Further, certain embodiments of the present invention can advantageously provide glass fibers having improved laser drilling response as compared to standard $B_2O_3$-containing E-glass fibers. Accordingly, the glass fibers according various non-limiting embodiments of the present invention can be particularly advantageous for use in PCB applications.

For example, in one non-limiting embodiment of a polymeric composite according to the present invention, there is provided a polymeric composite comprising a polymeric matrix material, and at least one glass fiber in the polymeric matrix material, the at least one glass fiber comprising:
- from 9 to 16 weight percent $Al_2O_3$;
- from 0.5 to 13 weight percent $B_2O_3$;
- from 16 to 25 weight percent CaO;
- 0 to 6 weight percent MgO;
- from 48 to 62 weight percent $SiO_2$;
- 0 to 4 weight percent $TiO_2$; and
- $R_2O_3$, wherein a molar ratio of $R_2O_3$ to $B_2O_3$ ranges from 0.01 to 0.33, and R is at least one rare earth element.

Although not limiting herein, the polymeric composites according to this non-limiting embodiment of the present invention are believed to be suitable for use in both electronic and structural applications.

In another non-limiting embodiment of a polymeric composite according to the present invention, there is provided a polymeric composite comprising a polymeric matrix material, and at least one glass fiber in the polymeric matrix material, the at least one glass fiber comprising:
- from 12 to 16 weight percent $Al_2O_3$;
- from 5 to 10 weight percent $B_2O_3$;
- from 16 to 25 weight percent CaO;
- 0 to 4 weight percent MgO;
- from 52 to 56 weight percent $SiO_2$;
- 0 to 0.8 weight percent $TiO_2$; and
- $R_2O_3$, wherein a molar ratio of $R_2O_3$ to $B_2O_3$ ranges from 0.01 to 0.33, and R is at least one rare earth element.

Although not limiting herein, the polymeric composites according to this non-limiting embodiment of the present invention are believed to be particularly suitable for use in electronic applications.

In another non-limiting embodiment of a polymeric composite according to the present invention, there is provided a polymeric composite comprising a polymeric matrix material, and at least one glass fiber in the polymeric matrix material, the at least one glass fiber comprising:
- from 9 to 16 weight percent $Al_2O_3$;
- from 0.5 to 13 weight percent $B_2O_3$;
- from 16 to 25 weight percent CaO;
- 0 to 6 weight percent MgO;
- from 48 to 62 weight percent $SiO_2$;
- 0 to 4 weight percent $TiO_2$; and
- $La_2O_3$, wherein a molar ratio of $La_2O_3$ to $B_2O_3$ ranges from 0.01 to 0.33.

Although not limiting herein, the polymeric composites according to this non-limiting embodiment of the present invention are believed to be suitable for use in both electronic and structural applications where appearance of the composite and cost are of importance.

In another non-limiting embodiment of a polymeric composite according to the present invention, there is provided a polymeric composite comprising a polymeric matrix material, and at least one glass fiber in the polymeric matrix material, the at least one glass fiber comprising:
- from 12 to 16 weight percent $Al_2O_3$;
- from 5 to 10 weight percent $B_2O_3$;
- from 16 to 25 weight percent CaO;
- 2 to 4 weight percent MgO;
- from 52 to 56 weight percent $SiO_2$;
- 0 to 0.8 weight percent $TiO_2$; and $R_2O_3$, wherein a molar ratio of $R_2O_3$ to $B_2O_3$ ranges from 0.01 to 0.33, and R is at least one rare earth element.

Although not limiting herein, the polymeric composites according to this non-limiting embodiment of the present invention are believed to be particularly suitable for use in electronics, and particularly, PCB applications.

In another non-limiting embodiment of a polymeric composite according to the present invention, there is provided a polymeric composite comprising a polymeric matrix material, and at least one glass fiber in the polymeric matrix material, the at least one glass fiber comprising:

from 12 to 16 weight percent $Al_2O_3$;
from 5 to 10 weight percent $B_2O_3$;
from 16 to 25 weight percent CaO;
0 to 4 weight percent MgO;
from 48 to 62 weight percent $SiO_2$;
0 to 1.0 weight percent $TiO_2$; and
$Nd_2O_3$, wherein a molar ratio of $Nd_2O_3$ to $B_2O_3$ ranges from 0.01 to 0.33.

Although not limiting herein, the polymeric composites according to this non-limiting embodiment of the present invention are believed to be particularly suitable for use in PCB applications involving laser drilling.

The polymeric composites and PCBs according to the various embodiments of the present invention can be made by any method known in the art for making polymeric composites and/or PCBs. For example, although not limiting herein, the polymeric composites according to the present invention can be made by impregnating woven fabrics or non-woven fabrics or mats of glass fibers with a polymeric matrix material and then curing the polymeric matrix material. Alternatively, chopped glass fibers can be incorporated into a polymeric matrix material and the resulting mixture extruded into a desired shape. Further, although not limiting herein, PCBs according to the present invention can be formed, for example, by impregnating a woven glass fabric with a polymeric matrix material and subsequently partially curing or "B-staging" the polymeric matrix material form a pre-preg. Thereafter, the pre-preg can be cut to the desired size and shape and one or more layers of pre-preg can be laminated together to form a laminate. Copper can be clad onto one or both surface of the laminate and, if desired, the copper can be patterned to form one or more circuits and/or one or more holes can be drilled into the clad-laminate to provide electrical interconnections. Thereafter, the laminates can be stacked together to form a PCB. However, it should be appreciated that other methods of forming polymeric composites and PCBs, which are not described above and that are suitable for use in forming the polymeric composites and PCBs of the presenting invention, are known in the art. Accordingly, the non-limiting examples given above are not intended to limit the present invention in any way and are provided merely for illustration.

Methods of inhibiting boron volatilization from glass compositions comprising $B_2O_3$ according to the present invention will now be described. One non-limiting embodiment of a method of inhibiting boron volatilization from a glass composition comprising $B_2O_3$ comprises adding $R_2O_3$ to the glass composition prior to processing the glass composition such that the glass composition, prior to processing, has a molar ratio of $R_2O_3$ to $B_2O_3$ ranging from 0.01 to 0.33, where R is at least one rare earth element, and processing the glass composition, wherein after processing, the glass composition has a relative boron loss of no greater than 5 percent. Further, according to this non-limiting embodiment of the present invention, the glass composition can have a relative boron loss of no greater than 2 percent during processing, or more desirably, can have no relative boron loss after processing.

As previously discussed, the addition of rare earth oxides to $B_2O_3$-containing glass compositions can advantageously reduce the volatization of boron from the glass composition by preferentially forming low vapor pressure rare earth-borate complexes. Although not required, according to this embodiment of the present invention, the glass composition can comprise from 2 to 13 weight percent $B_2O_3$. Further, although not required, when the glass composition is a fiberizable glass composition for use in making glass fibers suitable for electronic applications, the glass composition can comprises from 5 to 10 weight percent $B_2O_3$.

According to this embodiment of a method of inhibiting boron volatization from glass compositions comprising $B_2O_3$, the at least one rare earth element 'R' can be selected from the elements of Group 3 of the Periodic Table of the Elements, and is desirable selected from the group consisting of scandium (Sc), yttrium (Y), and the lanthanide series elements (i.e., the elements having atomic numbers 57 (lanthanum (La)) to 71 (lutetium (Lu)). As previously discussed with respect to the fiberizable glass compositions according to embodiments of the present invention, Sc, Y, and the lanthanide series elements have stable 3+ oxidation states and relatively high ionic potentials in glass (see Table 1 above). Accordingly, these elements can be particularly desirable for use in the methods of inhibiting boron volatization according to the present invention. However, generally any rare earth element having a stable 3+ oxidation state and a ionic potential in glass of at least 2.5 can be utilized in accordance with the method according to this embodiment of the present invention.

Further, although not limiting herein, according to the method of this non-limiting embodiment, processing the glass composition can comprise processing the glass composition at a log 3 forming temperature of the glass composition or greater. For example, processing can include melting the glass composition and/or forming fibers from the glass composition.

In one specific non-limiting example of a method according to this non-limiting embodiment of the present invention, which is believed to be useful in reducing boron volatization from standard $B_2O_3$-containing E-glass compositions formed using high-volume commercial processes, the rare earth element R is lanthanum.

Further, although not limiting herein, the method of inhibiting boron volatization according to the above-described embodiment of the present invention is particularly useful in conjunction with glass compositions comprising $B_2O_3$ and at least one alkali metal oxide. For example, although not limiting herein, the method of this non-limiting embodiment is particularly useful in reducing the volatization of boron from standard $B_2O_3$-containing E-glass compositions.

Various non-limiting embodiments of the present invention will now be illustrated in the following, non-limiting examples.

EXAMPLES

Example 1

Four glass batches having example glass compositions 1-4, respectively, given below in Table 2 and one glass batch having the comparative example glass composition "A" set forth in Table 2 were prepared as follows. Regent grade, oxide powders were blended as indicated in Table 2 to form the desired composition. After blending, each glass batch composition was heated to approximately 1450° C. in a platinum-10% rhenium crucible for about 4 hours to melt the glass composition. Thereafter, a "button" of each glass composition was then prepared by pouring the molten glass from the crucible into a stainless steel mold, which was subsequently placed into an oven at 750° C. for 3 hours. The power was then turned off to the oven and the glass was permitted to cool to room temperature in the oven overnight to allow the glass to anneal. The composition of the glass buttons is expected to be similar to that of the glass batch compositions, except for the loss of $B_2O_3$ during melting. As discussed below, the loss of $B_2O_3$ from the example glass compositions 1-4 is expected to be lower than for the comparative example glass composition A. Although, $Na_2O$ and $K_2O$, as well as fluoride if present, are volatile in glass melting, because of the low concentration of these materials in the glass compositions tested, any change to the overall glass compositions due to these materials volatizing is considered insignificant.

After cooling to room temperature, the buttons were analyzed using $^{11}B$ MAS NMR to determine the speciation of boron in each glass composition. Based on the NMR data, plots mol. % $B_2O_3$ in the form of $BO_3$ and mol. % $B_2O_3$ in the form of $BO_4$ versus mol. % $La_2O_3$ were generated. These plots are discussed above with reference to FIGS. 1a and 1b, respectively.

As previously discussed, as can be seen in FIGS. 1a and 1b, as the mol. % $La_2O_3$ in the glass composition increased, the mol. % $B_2O_3$ in the form of $BO_3$ structural units increased, while the mol. % $B_2O_3$ in the form of $BO_4$ structural units decreased. Accordingly, comparative example glass composition A was found to have a higher mol. % $B_2O_3$ in the form of $BO_4$ structural units than any of the example glass compositions 1-4. Further, the comparative example glass composition A was found to have a lower mol. % $B_2O_3$ in the form of $BO_3$ structural units than any of the example glass compositions 1-4.

As previously discussed, the formation of $BO_4$ structural units is associated with the formation of high vapor pressure alkali-borated complexes, whereas the formation of $BO_3$ structural units is associated with the formation of low vapor pressure rare earth-borate complexes. Accordingly, since example glass compositions 1-4 had higher percentage of $BO_3$ structural units and lower percentage of $BO_4$ structural units than the comparative example glass composition A, example glass compositions 1-4 are expected to have lower boron emissions than the comparative glass composition A during processing at elevated temperatures. Further, because $BO_3$ structural units are less polar than $BO_4$ structural units, the example glass compositions 1-4 are expected to have lower dielectric constants and dissipation factors as compared to the comparative example glass composition A.

Additionally, as indicated in Table 2, the liquidus temperature ("$T_L$"), log 3 forming temperature ("$T_F$"), and $\Delta T$ values for each glass composition was determined. Liquidus temperatures ($T_L$) were determined according to ASTM C829 "Standard Practices for Measurement of Liquidus Temperature of Glass by the Gradient Furnace Method." Log 3 forming temperatures ($T_F$) at 1000 poise melt viscosity were determined according to ASTM C965 "Standard Practice for Measuring Viscosity of Glass Above the Softening Point." As can be seen from Table 2, example glass compositions 2-4 had $T_L$, $T_F$ and $\Delta T$ values similar to the comparative example composition A. Although example glass composition 1 had a lower $\Delta T$ value than the comparative example composition A, example composition 1 is still considered to be suitable for use in commercial fiber forming operations.

TABLE 2

| | Glass Comp. No. | | | | | | | | | |
|---|---|---|---|---|---|---|---|---|---|---|
| | A | | 1 | | 2 | | 3 | | 4 | |
| | $La_2O_3/B_2O_3$ (mol ratio) | | | | | | | | | |
| | 0.00 | | 0.03 | | 0.05 | | 0.08 | | 0.15 | |
| | wt % | mol % | wt % | mol % | wt % | mol % | wt % | mol % | wt % | mol % |
| $Al_2O_3$ | 13.04 | 8.03 | 12.92 | 8.01 | 12.85 | 8.01 | 12.73 | 7.99 | 12.48 | 7.96 |
| $B_2O_3$ | 6.42 | 5.79 | 6.36 | 5.78 | 6.32 | 5.77 | 6.27 | 5.76 | 6.14 | 5.74 |
| CaO | 24.47 | 27.39 | 24.25 | 27.34 | 24.11 | 27.31 | 23.89 | 27.27 | 23.41 | 27.16 |
| $Fe_2O_3$ | 0.38 | 0.15 | 0.38 | 0.15 | 0.38 | 0.15 | 0.37 | 0.15 | 0.37 | 0.15 |
| K2O | 0.11 | 0.07 | 0.10 | 0.07 | 0.10 | 0.07 | 0.10 | 0.07 | 0.10 | 0.07 |
| $La_2O_3$ | 0.00 | 0.00 | 0.89 | 0.17 | 1.48 | 0.29 | 2.35 | 0.46 | 4.31 | 0.86 |
| MgO | 1.30 | 2.02 | 1.29 | 2.02 | 1.28 | 2.02 | 1.27 | 2.01 | 1.24 | 2.00 |
| $Na_2O$ | 0.40 | 0.41 | 0.40 | 0.41 | 0.40 | 0.41 | 0.39 | 0.41 | 0.39 | 0.41 |
| $SiO_2$ | 53.27 | 55.66 | 52.80 | 55.56 | 52.48 | 55.50 | 52.02 | 55.40 | 50.98 | 55.18 |
| $TiO_2$ | 0.61 | 0.48 | 0.60 | 0.48 | 0.60 | 0.48 | 0.59 | 0.48 | 0.58 | 0.47 |
| Total | 100.0 | 100.0 | 100.0 | 100.0 | 100.0 | 100.0 | 100.0 | 100.0 | 100.0 | 100.0 |
| $T_L$ (° C.) | 1070 | | 1074 | | 1065 | | 1065 | | 1060 | |
| $T_F$ (° C.) | 1169 | | 1128 | | 1167 | | 1159 | | 1157 | |
| $\Delta T$ (° C.) | 99 | | 54 | | 102 | | 94 | | 97 | |

Example 2

A glass batch having the example glass composition 4 set forth in Table 2 was prepared as discussed above in Example 1 along with a glass batch having the comparative example glass composition A. The weight loss as a function of time for each glass composition was then determined using TGA. Three 50.0 gram samples of each glass composition were individually tested. The TGA unit comprised a platinum-20% rhodium alloy crucible and suspension rod hanging inside a furnace. The suspension rod was connected to a digital balance outside the furnace having a precisions of 0.001 grams and weight changes measurements as function of time were automatically recorded every 30 seconds. The samples were heated to a temperature sufficient to achieve a melt viscosity of approximately 25 poise (which corresponded to a temperature of about 1470° C. for both glass compositions). After reaching the desired viscosity, the samples were held at that temperature for a period of 600 minutes. From the data collected for each glass compositions, graphs of average boron weight loss versus melting time (i.e., holding temperature) were generated. From this data, plots of average boron emission rate versus melting time (shown above in FIG. 2) for each glass composition were generated.

As indicated in the plot of FIG. 2, the boron emission rate from example glass composition 4 was lower than the boron emission rate from the comparative example composition A. Again, although not limiting herein and as previously discussed, this is believed to be attributable to the preferential formation of low vapor pressure rare earth-borate complexes during melting of example glass composition 4, as compared to the formation of high vapor pressure alkali-borate complexes in the comparative example glass composition A.

Example 3

A glass batch having the example glass composition 1 set forth in Table 2 was prepared as discussed above in Example 1 along with a glass batch having the comparative example glass composition A. Samples of each glass batch were then tested using TGA as described above in Example 2, however, a melt viscosity of approximately 35 poise (corresponded to a temperature of approximately 1447° C. for the example glass composition 1 and a temperature of approximately 1488° C. for the comparative example glass composition A) was used. As shown in FIG. 3, the glass composition according to the present invention (i.e., example glass composition 1) had a lower boron emission rate than comparative example glass composition A.

Example 4

Button, samples of each of the example glass compositions 5-22 set forth in Table 3 were made as discussed above in Example 1. The example glass compositions 5-22 were based on a designed experiment where the weight percent of $Al_2O_3$, $B_2O_3$, CaO, MgO, and $La_2O_3$ was randomly varied to simulate commercial fiber glass production, while with other minor oxides additions were kept constant. The amount of $SiO_2$ in each glass compositions was adjusted to achieve 100 weight percent total oxides.

After forming the button samples of each composition, the weight percent boron of each samples was quantitatively measured by Monarch Analytical Laboratory of Maumee, Ohio using a volumetric titration, wet analytical method. The relative boron loss was then calculated as the difference between the amount of $B_2O_3$ in the batch composition and the amount of $B_2O_3$ determined to be in the button sample divided by the amount of $B_2O_3$ in the glass batch composition.

As indicated in Table 3, the relative boron loss from the example glass compositions during melting was typically less than 1.5%. In comparison, the relative boron loss from commercial E-glass compositions containing similar amounts of $B_2O_3$ as example glass compositions 5-22 has been found by the inventors be around 5% (using the same wet analytical method).

Further, as shown in Table 3, example glass compositions 5-22 all had log 3 forming temperatures no greater than 1200° C. with ΔT values greater than 55° C.

TABLE 3

| | Glass Comp No. | | | | | | | | |
|---|---|---|---|---|---|---|---|---|---|
| | 5 | 6 | 7 | 8 | 9 | 10 | 11 | 12 | 13 |
| | $La_2O_3/B_2O_3$ (mol ratio) | | | | | | | | |
| | 0.030 | 0.028 | 0.030 | 0.030 | 0.028 | 0.030 | 0.030 | 0.032 | 0.032 |
| | Composition (wt %) | | | | | | | | |
| Al2O3 | 13.04 | 13.00 | 12.96 | 12.72 | 12.77 | 12.90 | 12.89 | 13.10 | 12.75 |
| B2O3 | 6.52 | 6.50 | 6.15 | 6.49 | 6.52 | 6.35 | 6.25 | 6.21 | 6.18 |
| CaO | 23.84 | 24.49 | 24.43 | 24.49 | 23.87 | 24.21 | 24.08 | 23.95 | 24.54 |
| Fe2O3 | 0.38 | 0.38 | 0.38 | 0.38 | 0.38 | 0.38 | 0.38 | 0.38 | 0.38 |
| K2O | 0.10 | 0.10 | 0.10 | 0.10 | 0.10 | 0.10 | 0.11 | 0.11 | 0.10 |
| La2O3 | 0.92 | 0.86 | 0.86 | 0.92 | 0.86 | 0.89 | 0.87 | 0.93 | 0.92 |
| MgO | 1.17 | 1.16 | 1.39 | 1.40 | 1.40 | 1.28 | 1.18 | 1.41 | 1.17 |
| Na2O | 0.40 | 0.40 | 0.40 | 0.40 | 0.40 | 0.40 | 0.40 | 0.40 | 0.40 |
| SiO2 | 52.87 | 52.36 | 52.57 | 52.35 | 52.93 | 52.71 | 53.07 | 52.76 | 52.81 |
| SrO | 0.13 | 0.13 | 0.13 | 0.13 | 0.13 | 0.13 | 0.14 | 0.13 | 0.13 |
| TiO2 | 0.60 | 0.60 | 0.60 | 0.60 | 0.60 | 0.60 | 0.61 | 0.61 | 0.60 |
| ZrO2 | 0.02 | 0.02 | 0.02 | 0.02 | 0.02 | 0.02 | 0.02 | 0.02 | 0.02 |
| Total | 100.00 | 100.00 | 100.00 | 100.00 | 100.00 | 100.00 | 100.00 | 100.00 | 100.00 |
| | Properties | | | | | | | | |
| B2O3 (wt %) | 6.47 | 6.42 | 6.11 | 6.43 | 6.34 | 6.26 | 6.22 | 6.23 | 6.19 |
| Relative B Loss (%) | 0.77 | 1.23 | 0.65 | 0.92 | 2.76 | 1.42 | 0.48 | * | * |
| $T_L$ (° C.) | 1059 | 1066 | 1069 | 1068 | 1064 | 1066 | 1068 | 1064 | 1085 |
| $T_F$ (° C.) | 1172 | 1160 | 1168 | 1156 | 1161 | 1162 | 1163 | 1164 | 1163 |
| ΔT (° C.) | 113 | 94 | 99 | 88 | 97 | 96 | 95 | 100 | 78 |

| | Glass Comp No. | | | | | | | | |
|---|---|---|---|---|---|---|---|---|---|
| | 14 | 15 | 16 | 17 | 18 | 19 | 20 | 21 | 22 |
| | $La_2O_3/B_2O_3$ (mol ratio) | | | | | | | | |
| | 0.030 | 0.028 | 0.030 | 0.030 | 0.028 | 0.030 | 0.030 | 0.032 | 0.032 |
| | Composition (wt %) | | | | | | | | |
| Al2O3 | 13.09 | 12.81 | 13.03 | 12.90 | 12.84 | 13.06 | 12.77 | 12.71 | 12.91 |
| B2O3 | 6.21 | 6.21 | 6.18 | 6.35 | 6.56 | 6.53 | 6.19 | 6.49 | 6.45 |
| CaO | 23.94 | 23.93 | 24.56 | 24.21 | 23.99 | 23.88 | 24.58 | 24.48 | 24.34 |
| Fe2O3 | 0.38 | 0.38 | 0.38 | 0.38 | 0.38 | 0.38 | 0.38 | 0.38 | 0.37 |

TABLE 3-continued

| | | | | | | | | | |
|---|---|---|---|---|---|---|---|---|---|
| K2O | 0.11 | 0.10 | 0.10 | 0.10 | 0.11 | 0.10 | 0.10 | 0.10 | 0.10 |
| La2O3 | 0.87 | 0.93 | 0.92 | 0.89 | 0.93 | 0.86 | 0.86 | 0.86 | 0.91 |
| MgO | 1.17 | 1.41 | 1.17 | 1.28 | 1.18 | 1.40 | 1.40 | 1.16 | 1.39 |
| Na2O | 0.40 | 0.40 | 0.40 | 0.40 | 0.40 | 0.40 | 0.40 | 0.40 | 0.40 |
| SiO2 | 53.08 | 53.07 | 52.50 | 52.71 | 52.86 | 52.62 | 52.56 | 52.67 | 52.37 |
| SrO | 0.13 | 0.13 | 0.13 | 0.13 | 0.13 | 0.13 | 0.13 | 0.13 | 0.13 |
| TiO2 | 0.60 | 0.60 | 0.60 | 0.60 | 0.61 | 0.60 | 0.60 | 0.60 | 0.60 |
| ZrO2 | 0.02 | 0.02 | 0.02 | 0.02 | 0.02 | 0.02 | 0.02 | 0.02 | 0.02 |
| Total | 100.00 | 100.00 | 100.00 | 100.00 | 100.00 | 100.00 | 100.00 | 100.00 | 100.00 |
| Properties | | | | | | | | | |
| B2O3 (wt %) meas | 6.04 | 6.22 | 6.08 | 6.26 | 6.51 | 6.46 | 6.12 | 6.25 | 6.35 |
| Relative B Loss (%) | 2.74 | * | 1.62 | 1.42 | 0.76 | 1.07 | 1.13 | 3.70 | 1.55 |
| $T_L$ (° C.) | 1064 | 1065 | 1080 | 1061 | 1057 | 1051 | 1083 | 1081 | 1071 |
| $T_F$ (° C.) | 1172 | 1168 | 1158 | 1161 | 1170 | 1166 | 1160 | 1164 | 1171 |
| $\Delta T$ (° C.) | 108 | 103 | 78 | 100 | 113 | 115 | 77 | 83 | 100 |

*No boron loss could be detected in the sample as the difference between the weight percent boron in the batched composition and the weight percent boron in the button sample as measured using the wet analytical method discussed above were within experimental error.

Example 5

As previously discussed, in addition having reduced boron volatization, the fiberizable glass compositions according the embodiments of the present invention can have desirable dielectric properties. For example, Table 4 below shows the dielectric constants and dissipation factors for two example glass compositions (23 and 24, respectively) according to the non-limiting embodiments of the present invention and comparative example glass composition (labeled as glass composition B). Both the example glass compositions 23 and 24 and the comparative example glass composition. B included about 6 wt. % $B_2O_3$ and about 0.6 wt. % MgO. The comparative example. glass composition B also included about 0.01 wt. % $K_2O$, about 0.9 wt. % Na2O, about 0.1 wt. % SrO, and about 0.02 wt. % $ZrO_2$, which simulate impurity levels typically seen in commercial E-glass compositions.

Glass button samples of each of the glass composition shown below in Table 4 were prepared as indicated above in Example 1. Dielectric constant and dissipation factor measurements were then taken on each glass button sample at 1 MHz and 1 GHz, respectively. The dielectric constant and dissipation factor measurements were performed (by Trace. Lab-East of Hunt Valley, Md.) according to ASTM D150-98 "Standard Test Methods for AC Loss Characteristics and Permittivity (Dielectric Constant) of Solid Electrical Insulation."

As indicated in Table 4, the dielectric constants ("Dk") at 1 MHz for the example glass compositions 23 and 24 were no greater than 7.5 and the dissipation factors of the example fiberizable glass compositions were no greater than 0.01. Further, the Dk at 1 MHz for the example fiberizable glass compositions 23 and 24 were less than 7.3 and the Df at 1 MHz for the example fiberizable glass compositions 23 and 24 were no greater than 0.005.

Further, the Dk and Df values of the example glass compositions 23 and 24 at 1 GHz, were lower than for comparative example fiberizable glass composition B. Although the simulated alkali metal oxide impurities in the comparative example glass composition B can theoretical increase the dielectric constant and dissipation factor of this glass composition, it is believed that the substantially larger CaO content of the glass composition will have the predominate effect on the dielectric properties in this glass composition.

Further, as shown in Table 4, example fiberizable glass compositions 23 and 24 had log 3 forming temperatures no greater than 1200° C. with $\Delta T$ values greater than 55° C.

TABLE 4

| | Glass Comp. No. | | | | | |
|---|---|---|---|---|---|---|
| | B | | 23 | | 24 | |
| | | | Mol. Ratio $La_2O_3/B_2O_3$ | | | |
| | 0.00 | | 0.06 | | 0.12 | |
| | wt % | mol % | wt % | mol % | wt % | mol % |
| Al2O3 | 13.86 | 8.57 | 13.88 | 8.73 | 13.64 | 8.70 |
| B2O3 | 6.03 | 5.46 | 6.03 | 5.56 | 5.93 | 5.54 |
| CaO | 22.97 | 25.82 | 23.00 | 26.31 | 22.61 | 26.22 |
| F2 | 0.70 | 1.16 | 0 | 0 | 0 | 0 |
| Fe2O3 | 0.36 | 0.14 | 0.36 | 0.14 | 0.35 | 0.14 |
| K2O | 0.10 | 0.07 | 0 | 0 | 0 | 0 |
| La2O3 | 0.00 | 0.00 | 1.69 | 0.33 | 3.33 | 0.67 |
| MgO | 0.58 | 0.91 | 0.58 | 0.92 | 0.57 | 0.92 |
| Na2O | 0.87 | 0.89 | 0 | 0 | 0 | 0 |
| SiO2 | 53.82 | 56.46 | 53.89 | 57.54 | 52.99 | 57.35 |
| SrO | 0.13 | 0.08 | 0 | 0 | 0 | 0 |
| TiO2 | 0.57 | 0.08 | 0.57 | 0.46 | 0.56 | 0.46 |
| ZrO2 | 0.02 | 0.01 | 0 | 0 | 0 | 0 |
| Total | 100.0 | 100.0 | 100.0 | 100.0 | 100.0 | 100.0 |
| $T_L$ (° C.) | 1075 | | 1108/1106 | | 1090 | |
| $T_F$ (° C.) | 1184 | | 1215/1204 | | 1201 | |
| $\Delta T$ (° C.) | 109 | | 107/98 | | 111 | |
| Dk, 1 MHz | 7.36 | | 7.10 | | 7.27 | |
| Dk, 1 GHz | 7.34 | | 6.89 | | 7.15 | |
| Df, 1 MHz | 0.0112 | | 0.0045 | | 0.0046 | |
| Df, 1 GHz | 0.1367 | | 0.0035 | | 0.0404 | |

Example 6

Table 5 below shows the dielectric constants and dissipation factors for two example glass compositions (25 and 26, respectively) according to the non-limiting embodiments of the present invention, and a comparative example glass composition (labeled as glass composition C). The example glass compositions included from about 8 to about 10 wt. % $B_2O_3$, and $La_2O_3$ in a molar ratio of $La_2O_3/B_2O_3$ of about 0.02; while the comparative example glass composition contained about 10 wt. % $B_2O_3$ and no rare earth oxide. Further, all of the fiberizable glass compositions shown in Table 5 included between 2 to 3 wt. % MgO.

Glass button samples of each of the fiberizable glass compositions shown below in Table 4 were prepared as indicated above in Example 1 and dielectric constant and dissipation factor measurements were taken as describe above in Example 5. As indicated in Table 5, the dielectric constant at both 1 MHz and 1 GHz for example composition 25 were slightly higher than the comparative example composition C. However, the dissipation factor at both 1 MHz and 1 GHz for example composition 25 were lower than for the comparative example composition C. Example fiberizable glass composition 26 also had a slightly higher dielectric constant than comparative composition C, however, this is believed to be attributable, in part, to the lower $B_2O_3$ content of example composition 26 as compared to the comparative example composition C. Nevertheless, example composition 26 did have significantly lower Df values at both 1 MHz and 1 GHz than comparative example composition C.

Although not meant to be bound by any particular theory, it is believed by the inventors that the dielectric properties of comparative example glass composition C may be better than expected for commercially available $B_2O_3$-containing E-glass for electronics applications because of the relatively high MgO content of composition C.

Additionally, as shown in Table 5, fiberizable glass compositions 25 and 26 had log 3 forming temperatures no greater than 1200° C. with ΔT values greater than 55° C.

TABLE 5

| | Glass Comp. No. | | | | | |
|---|---|---|---|---|---|---|
| | C | | 25 | | 26 | |
| | Mol. Ratio $La_2O_3/B_2O_3$ | | | | | |
| | 0.00 | | 0.02 | | 0.02 | |
| | wt % | mol % | wt % | mol % | wt. % | mol % |
| $Al_2O_3$ | 13.49 | 8.33 | 13.36 | 8.31 | 13.66 | 8.48 |
| $B_2O_3$ | 10.17 | 9.19 | 10.07 | 9.17 | 8.12 | 7.38 |
| CaO | 19.76 | 22.17 | 19.57 | 22.13 | 20.00 | 22.57 |
| $F_2$ | 0.34 | 0.57 | 0.34 | 0.56 | 0.35 | 0.58 |
| $Fe_2O_3$ | 0.35 | 0.14 | 0.35 | 0.14 | 0.35 | 0.14 |
| $K_2O$ | 0.10 | 0.06 | 0.10 | 0.06 | 0.10 | 0.07 |
| $La_2O_3$ | 0 | 0 | 0.97 | 0.19 | 0.94 | 0.18 |
| MgO | 2.43 | 3.80 | 2.41 | 3.79 | 2.46 | 3.86 |
| $Na_2O$ | 0.42 | 0.43 | 0.42 | 0.43 | 0.43 | 0.44 |
| $SiO_2$ | 52.39 | 54.87 | 51.88 | 54.77 | 53.04 | 55.86 |
| SrO | 0 | 0 | 0 | 0 | 0 | 0 |
| $TiO_2$ | 0.56 | 0.44 | 0.55 | 0.44 | 0.56 | 0.45 |
| $ZrO_2$ | 0 | 0 | 0 | 0 | 0 | 0 |
| Total | 100.0 | 100.0 | 100.0 | 100.0 | 100.0 | 100.0 |
| $T_L$ (° C.) | 1085 | | 1076 | | 1077 | |
| $T_F$ (° C.) | 1170 | | 1161 | | 1181 | |
| ΔT (° C.) | 85 | | 85 | | 104 | |
| Dk, 1 MHz | 7.01 | | 7.03 | | 7.11 | |
| Dk, 1 GHz | 6.83 | | 6.94 | | 6.97 | |
| Df, 1 MHz | 0.0038 | | 0.0026 | | 0.0020 | |
| Df, 1 GHz | 0.0440 | | 0.0144 | | 0.0052 | |

It is to be understood that the present description illustrates aspects of the invention relevant to a clear understanding of the invention. Certain aspects of the invention that would be apparent to those of ordinary skill in the art and that, therefore, would not facilitate a better understanding of the invention have not been presented in order to simplify the present description. Although the present invention has been described in connection with certain embodiments, the present invention is not limited to the particular embodiments disclosed, but is intended to cover modifications that are within the spirit and scope of the invention, as defined by the appended claims.

The invention claimed is:

1. A fiberizable glass composition comprising,
   from 9 to 16 weight percent $Al_2O_3$;
   from 5 to 13 weight percent $B_2O_3$;
   from 16 to 25 weight percent CaO;
   0 to 6 weight percent MgO;
   from 48 to 62 weight percent $SiO_2$;
   0 to 4 weight percent $TiO_2$; and
   $R_2O_3$, wherein a molar ratio of $R_2O_3$ to $B_2O_3$ ranges from 0.01 to 0.33, and R is at least one rare earth element selected from the group consisting of Sc, Y, La, Nd, Sm, Eu, Gd, Er, and Lu.

2. The glass composition of claim 1 wherein the fiberizable glass composition has a log3 forming temperature no greater than 1200° C.; a liquidus temperature no greater than 1140° C. and a ΔT of at least 55° C.

3. The fiberizable glass composition of claim 1 wherein the glass composition comprises from 5 to 10 weight percent $B_2O_3$.

4. The fiberizable glass composition of claim 1 wherein molar ratio of $R_2O_3$ to $B_2O_3$ ranges from 0.01 to 0.15.

5. The fiberizable glass composition of claim 1 wherein the rare earth element has an oxidation state of 3+ and an ionic potential in glass of at least 2.5.

6. The fiberizable glass composition of claim 1 wherein the fiberizable glass composition comprises a molar ratio of $BO_3$ structural units to a sum of $BO_3$ structural units plus $BO_4$ structural units of at least 0.775.

7. The fiberizable glass composition of claim 1 wherein the glass composition has a relative boron loss of less than 5 percent.

8. The fiberizable glass composition of claim 1 wherein the glass composition has a dielectric constant at 1 MHz of no greater than 7.5.

9. The fiberizable glass composition of claim 1 wherein the glass composition has a dissipation factor at 1 MHz of no greater than 0.01.

10. The fiberizable glass composition of claim 1 further comprising from 0 to 1.0 weight percent $Fe_2O_3$; no more than 1 weight percent $F_2$; and 0 to 2 wt. % of at least one alkali metal oxides selected from the group consisting of $Na_2O$, $K_2O$, and $Li_2O$.

11. The fiberizable glass composition of claim 1 comprising,
   from 12 to 16 weight percent $Al_2O_3$;
   from 5 to 10 weight percent $B_2O_3$;
   from 16 to 25 weight percent CaO;
   0 to 4 weight percent MgO;
   from 52 to 56 weight percent $SiO_2$;
   0 to 0.8 weight percent $TiO_2$; and
   $R_2O_3$, wherein a molar ratio of $R_2O_3$ to $B_2O_3$ ranges from 0.01 to 0.33, and R is at least one rare earth element selected from the group consisting of Sc, Y, La, Nd, Sm, Eu, Gd, Er, and Lu.

12. The fiberizable glass composition of claim 1 wherein $R_2O_3$ comprises $La_2O_3$.

13. The fiberizable glass composition of claim 1 wherein the MgO content is from 2 to 4 weight percent.

14. The fiberizable glass composition of claim 11 wherein $R_2O_3$ comprises $Nd_2O_3$.

15. A glass fiber comprising the glass composition of claim 1.

16. A polymeric composite comprising:
   a polymeric matrix material; and
   at least one glass fiber in the polymeric matrix material, the at least one glass fiber comprising the glass composition of claim 1.

17. The polymeric composite of claim 16, wherein the polymeric composite is a substrate for an electronic circuit.

* * * * *